US 6,674,563 B2

(12) United States Patent
Chui et al.

(10) Patent No.: US 6,674,563 B2
(45) Date of Patent: Jan. 6, 2004

(54) METHOD AND APPARATUS FOR DEVICE LINEARIZATION

(75) Inventors: Benjamin Wai-ho Chui, Sunnyvale, CA (US); Timothy Stowe, Palo Alto, CA (US); Asif A. Godil, Mountain View, CA (US)

(73) Assignee: LightConnect, Inc., Newark, CA (US)

( * ) Notice: Subject to any disclaimer, the term of this patent is extended or adjusted under 35 U.S.C. 154(b) by 0 days.

(21) Appl. No.: 09/855,873

(22) Filed: May 14, 2001

(65) Prior Publication Data

US 2002/0015216 A1 Feb. 7, 2002

Related U.S. Application Data

(63) Continuation-in-part of application No. 09/548,788, filed on Apr. 13, 2000, now Pat. No. 6,501,600.

(51) Int. Cl.$^7$ .............................................. G02B 26/00
(52) U.S. Cl. ........................................ 359/291; 359/290
(58) Field of Search ................................ 359/291, 292, 359/290, 298, 295, 569, 566; 348/217; 363/21; 324/142; 34/657

(56) References Cited

U.S. PATENT DOCUMENTS

| | | | | |
|---|---|---|---|---|
| 3,824,585 A | * | 7/1974 | Meijer ........................ 341/140 |
| 5,617,020 A | * | 4/1997 | Campbell et al. ........... 324/142 |
| 5,629,801 A | | 5/1997 | Staker et al. ................ 359/572 |
| 5,661,592 A | | 8/1997 | Bornstein et al. ........... 359/291 |
| 5,696,491 A | * | 12/1997 | White et al. ................. 340/657 |
| 5,724,336 A | * | 3/1998 | Morton ........................ 369/126 |
| 5,731,802 A | | 3/1998 | Aras ............................ 345/692 |
| 5,764,280 A | | 6/1998 | Bloom et al. ................. 348/53 |
| 5,798,743 A | | 8/1998 | Bloom ......................... 345/90 |
| 5,808,797 A | | 9/1998 | Bloom et al. ................ 359/572 |
| 5,841,579 A | | 11/1998 | Bloom et al. ................ 359/572 |
| 5,880,777 A | * | 3/1999 | Savoye et al. .............. 348/217 |
| 5,943,223 A | * | 8/1999 | Pond ............................ 363/53 |
| 5,982,553 A | | 11/1999 | Bloom et al. ................ 359/627 |
| 5,986,634 A | | 11/1999 | Aloishin et al. ............. 345/649 |
| 6,004,912 A | | 12/1999 | Gudeman .................... 508/577 |
| 6,064,404 A | | 5/2000 | Aras et al. ................... 345/530 |
| 6,069,576 A | | 5/2000 | Gwin ........................... 341/112 |
| 6,088,102 A | | 6/2000 | Manhart ...................... 356/499 |
| 6,101,036 A | | 8/2000 | Bloom ......................... 359/567 |
| 6,127,908 A | * | 10/2000 | Bozler et al. ................ 333/246 |
| 6,130,770 A | | 10/2000 | Bloom ......................... 359/224 |
| 6,178,284 B1 | | 1/2001 | Bergmann et al. .......... 385/140 |
| 6,215,579 B1 | | 4/2001 | Bloom et al. ................ 359/298 |
| 6,251,842 B1 | | 6/2001 | Gudeman .................... 508/577 |
| 6,271,808 B1 | | 8/2001 | Corbin ......................... 345/7 |
| 6,373,007 B1 | * | 4/2002 | Calcatera et al. ............ 200/181 |

* cited by examiner

Primary Examiner—Georgia Epps
Assistant Examiner—William Choi
(74) Attorney, Agent, or Firm—James E. Eakin

(57) ABSTRACT

Various embodiments are disclosed of apparatuses and methods for linearization. A linearized signal can control, for example, a microelectromechanical device, a microelectromechanical device, and/or a device controlling a modulated intensity of electromagnetic energy. Some embodiments include linearization functions such as a logarithm or $x/(a+x)$.

5 Claims, 6 Drawing Sheets

METHOD AND APPARATUS FOR DEVICE LINEARIZATION

CROSS REFERENCE TO RELATED APPLICATION

This application is a continuation-in-part of and claims the benefit of priority from the U.S. application Ser. No. 09/548,788, filed Apr. 13, 2000, now U.S. Pat. No. 6,501,600, which application is fully incorporated herein by reference.

BACKGROUND OF THE INVENTION

1. Field of the Invention

The field relates to linearization of a response to a signal. More particularly, the field relates to linearizing a response, such as an intensity from a light-modulating device, to an input signal.

2. Description of the Related Art

Many systems, in response to a linear input, exhibit a highly nonlinear output response. Such a nonlinear response can complicate the control of the system output. Therefore, what is needed is a way to linearize a system output relative to a system input.

SUMMARY OF THE INVENTION

Some embodiments can comprise two relatively constant signal references coupled to each other by two or more signal components coupled in series. The first signal component can include a variable signal component controlled by an external input signal. The second signal component can include a relatively fixed signal component. The output node can include a node coupling the variable signal component and the relatively fixed signal component. The output node can provide an output signal controlling, for example, a microelectromechanical device, and/or a device controlling a modulated intensity of electromagnetic energy.

Some embodiments can comprise an input node coupled to an output node via an intermediate circuit. The intermediate circuit can comprise a logarithm circuit and/or a lookup table. The output node can provide an output signal controlling, for example, a microelectromechanical device, and/or a device controlling a modulated intensity of electromagnetic energy.

Some embodiments comprise receiving a first signal determining a first quantity responsive to the first signal, generating a second signal determined at least by a lookup table, and sending the second signal to, for example, a microelectromechanical device adapted to respond to the second signal, and/or a device adapted to respond to the second signal. The device can control a modulated intensity of electromagnetic energy.

Some embodiments can comprise receiving a first signal, determining a first quantity responsive to the first signal, generating a second signal determined at least by a quotient, and sending the second signal to, for example, a microelectromechanical device adapted to respond to the second signal, and/or a device adapted to respond to the second signal. The quotient can comprise the first quantity divided by a sum, and the sum can comprise an addition of the first quantity and a second quantity. The device can control a modulated intensity of electromagnetic energy.

Some embodiments can comprise receiving a first input, and, responsive to the first input, sending a second input to an element, for example, a microelectromechanical device, and/or a device controlling a modulated intensity of electromagnetic energy. The second input can substantially linearize the first input, over a range of the first input, relative to an output of the element. The output of the element can be substantially proportional to the first input over the range of the first input.

Some embodiments can comprise receiving a first input, processing the first input through at least one circuit to produce a second input, and sending the second input to a device controlling a modulated intensity of electromagnetic energy. The modulated intensity can be substantially proportional to the first input over a range of the first input.

Some embodiments can comprise receiving a first signal, determining a first quantity responsive to the first signal, generating a second signal determined at least by a logarithm of at least the first quantity, and sending the second signal to, for example, a microelectromechanical device adapted to respond to the second signal, and/or a device adapted to respond to the second signal. The device can control a modulated intensity of electromagnetic energy.

DETAILED DESCRIPTION

Some embodiments are related to linearization of the transfer function of an element, for example, an electrically actuated membrane. In some applications, the membrane can be used as part of a microelectromechanical grating. The grating can act as a lightvalve, or variable optical attenuator (VOA).

In one embodiment, a membrane has openings suspended above a substrate covering about 50% of the overall substrate area. Both the top surface of the membrane and the exposed surface of the substrate can be optically reflective and/or transmissive. Light reflected and/or transmitted from the membrane and light reflected and/or transmitted from the substrate can have a certain phase difference depending on the distance between the membrane and the substrate. Depending on the phase difference, the two sources of reflected and/or transmitted light interfere either constructively or destructively, leading to possible attenuation of the reflected and/or transmitted light. The extent of attenuation can therefore be controlled by adjusting the position of the membrane.

In one embodiment, movement of the membrane can be accomplished electrostatically. A top surface of the membrane can be metallized to form a top electrode, and the substrate can be made electrically conductive to form a bottom electrode. A voltage applied across the two electrodes can cause the membrane to be attracted towards the substrate. The amount of deflection can depend on the amplitude of the voltage applied.

For any given membrane deflection, one can calculate a voltage required to produce that deflection. The following is one example of a relationship between the voltage and the deflection, where σ is the (tensile) stress of the membrane film, $t_{membrane}$ is the thickness of the membrane, $\epsilon_r$ is the relative dielectric constant of the membrane material, $\epsilon_{air}$ is the relative dielectric constant of air (about 1), $\epsilon_0$ is the permittivity of free space, D is the distance from the bottom of the membrane to the substrate, ΔD is the deflection of the membrane, and L is the length of the membrane:

$$V_{applied} = \sqrt{\frac{\left(\frac{t_{membrane}}{\varepsilon_r} + \frac{D}{\varepsilon_{air}} - \Delta D\right)^2}{L^2 \varepsilon_0}}$$

For any given membrane deflection, one can calculate the expected optical attenuation resulting from that deflection. The following is one example of a relationship between the optical attenuation and the deflection, where $I_{reflected}$ is the reflected light intensity, ΔD is the deflection of the membrane, and λ is the wavelength of the light:

$$I_{reflected} = \cos^2\left(\frac{2\pi \Delta D}{\lambda}\right)$$

Figure 1:
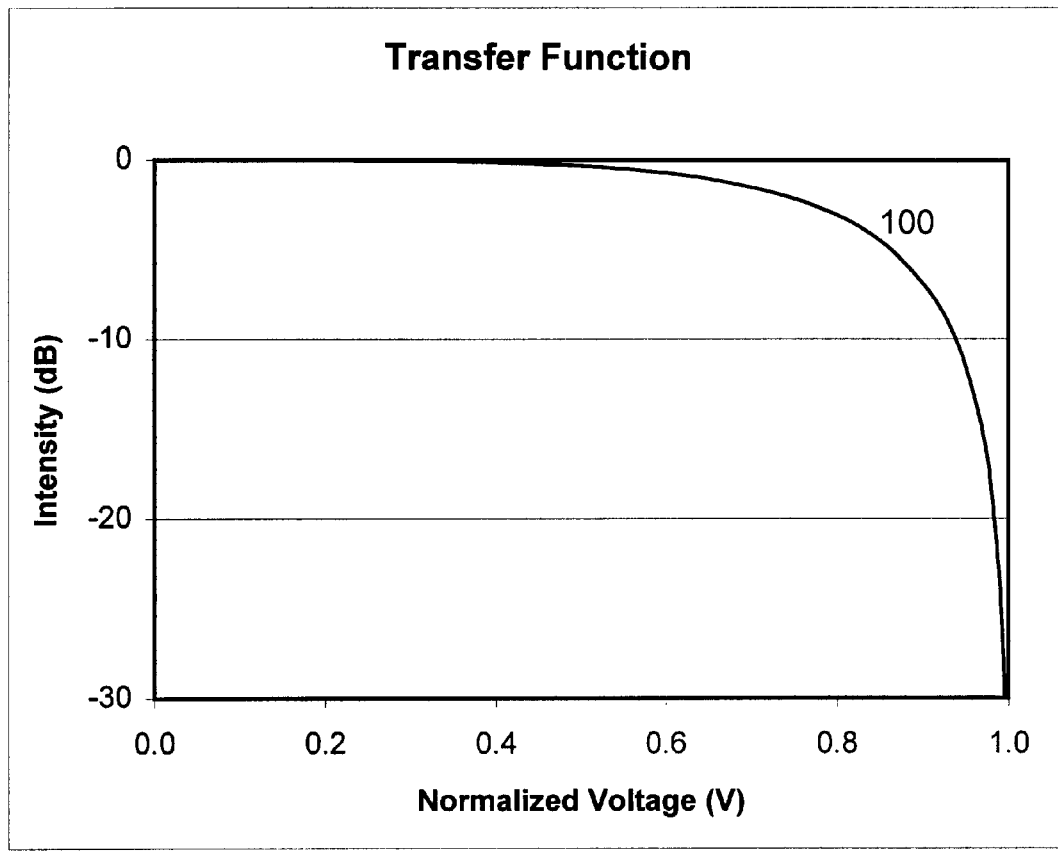
FIG. 1 shows a graph of a nonlinear transfer function.

FIG. 1 shows a graph of a transfer function 100 of attenuation plotted versus voltage, using the above formulas. One embodiment linearizes the transfer function of FIG. 1.

The transfer function 100 can be very nonlinear. In one example of the transfer function 100, the attenuation can vary very slowly with voltage at low voltages, but can change very quickly at high voltages. Nonlinear behavior can create difficulties in control of the element. Therefore, it can be advantageous to linearize the transfer function 100.

Figure 2:
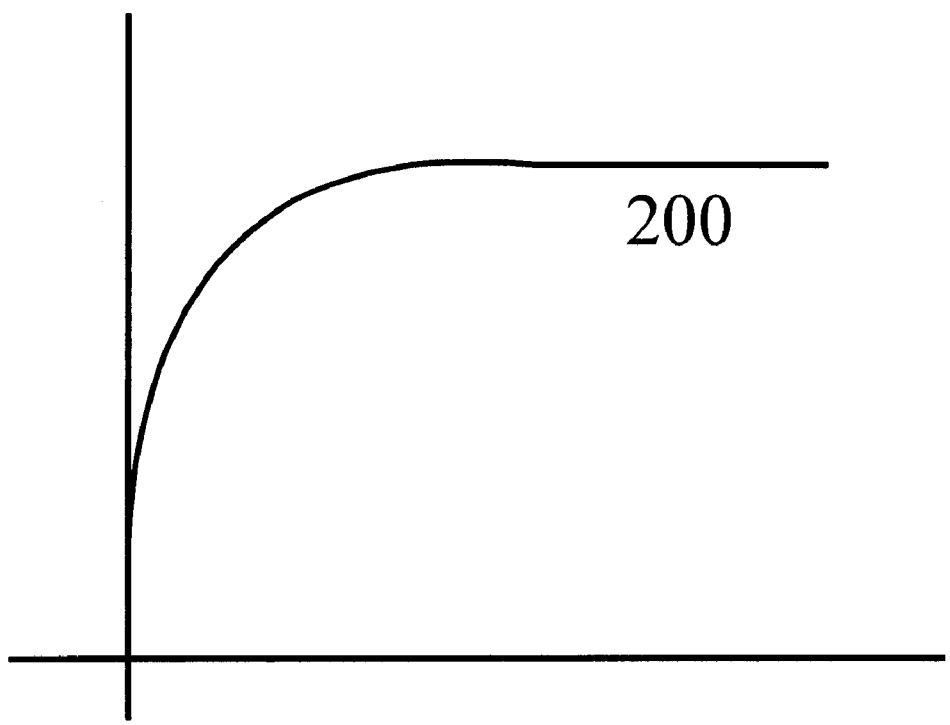
FIG. 2 shows an example of a linearizing transfer function for the nonlinear transfer function of FIG. 1.

In some embodiments, linearization can be accomplished by inserting an intermediate transfer function 200, somewhere before the element. The transfer function 200 can have largely opposite characteristics to transfer function 100. For example, transfer function 200 can initially vary quickly with voltage, then vary slowly. FIG. 2 shows one example of a transfer function 200. Various embodiments of the transfer function 200 can include, for example, a logarithmic function, and/or a function x/(a+x), where a is some constant and x is some variable.

Figure 3:
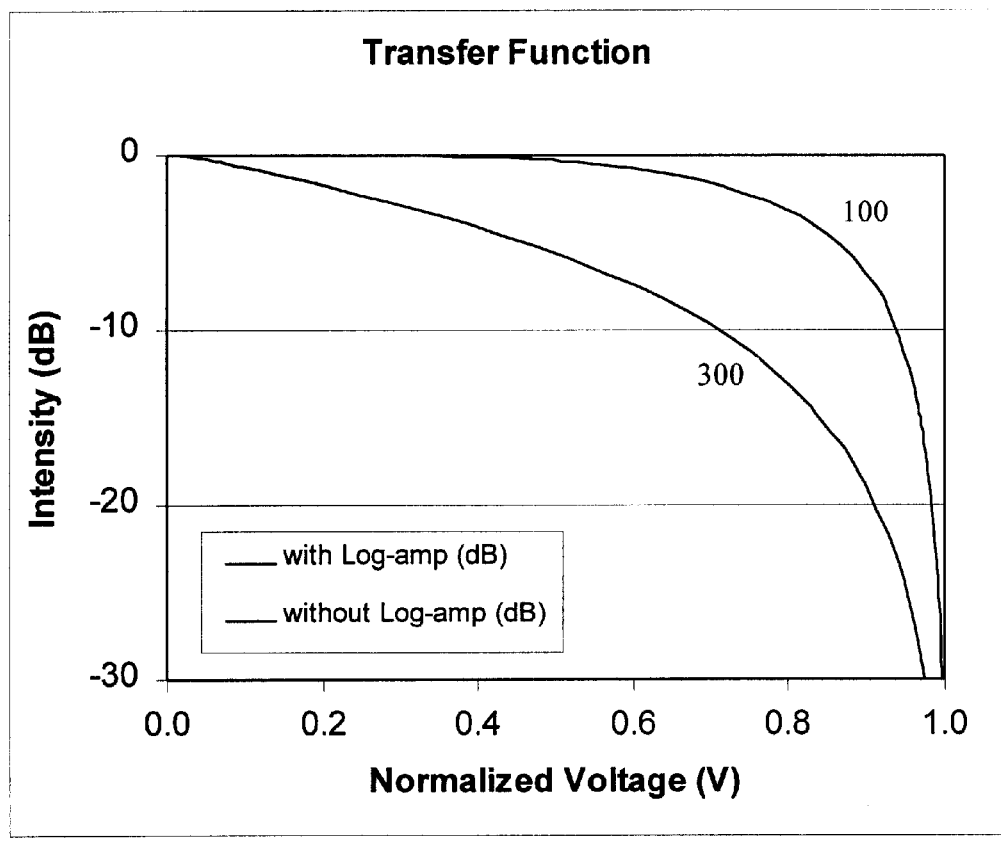
FIG. 3 shows a graph of a curve resulting from inserting, before a nonlinear transfer function, a linearizing transfer function including a logarithmic function.
Figure 4:
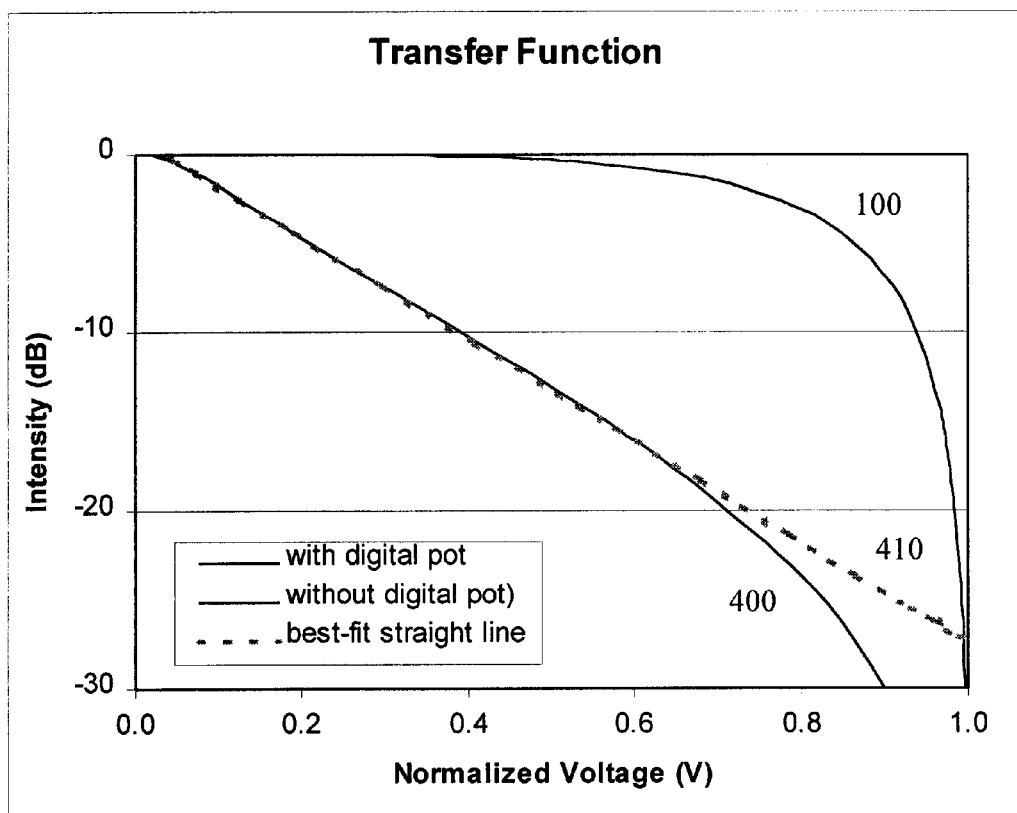
FIG. 4 shows a graph a curve resulting from inserting, before a nonlinear transfer function, a linearizing transfer function including a function $x/(a+x)$.

FIG. 3 shows a graph of curve 300 resulting from inserting transfer function 200 before transfer function 100 for an embodiment where transfer function 200 includes a logarithmic function. FIG. 4 shows a graph of curve 400 for a case where transfer function 200 includes a function x/(a+x). FIG. 4 also shows a graph of curve 410 demonstrating ideal linearization. In one embodiment, the non-linearity can be within 1%, within the range of 2.5 dB to 17.5 dB. Other embodiments can demonstrate other nonlinearities and/or other ranges.

Some embodiments can comprise receiving a first signal, determining a first quantity responsive to the first signal, generating a second signal determined at least by a quotient, and sending the second signal to an element, for example, a membrane adapted to respond to the second signal, a microelectromechanical device adapted to respond to the second signal, and/or a device adapted to respond to the second signal. The quotient can comprise the first quantity divided by a sum, and the sum can comprise an addition of the first quantity and a second quantity. The first quantity can comprise a variable resistance determined at least by the first signal and/or a variable reactance determined at least by the first signal. The variable reactance can comprise at least one inductance and/or at least one capacitance. The second quantity can comprise a constant. The constant can comprise a resistance, for example in a plurality of resistances. The constant can comprise at least one reactance. The reactance can comprise at least one inductance and/or at least one capacitance. A response of the element can be made substantially proportional to the first signal over a range of the first signal, for example, due at least to the second signal. The device can control a reflected and/or transmitted intensity of electromagnetic energy. At least part of the electromagnetic energy can reside within, for example, in the optical C-band, or the optical L-band, or the both the L-band and the C-band from about 1530 nm to about 1610 nm.

Some embodiments can comprise receiving a first input, processing the first input through at least one look up table to produce a second input, and sending the second input to a device controlling a modulated intensity of electromagnetic energy. At least part of the electromagnetic energy can reside within, for example, in the optical C-band, or the optical L-band, or the both the L-band and the C-band from about 1530 nm to about 1610 nm. The modulated intensity can be made substantially proportional to the first input over a range of the first input. Other embodiments can further comprise receiving the second input at the device, and controlling the modulated intensity of the device responsive to the second input.

Some embodiments can comprise receiving a first signal, determining a first quantity responsive to the first signal, generating a second signal determined at least by a logarithm of at least the first quantity, and sending the second signal to an element, for example, a membrane adapted to respond to the second signal, a microelectromechanical device adapted to respond to the second signal, and/or a device adapted to respond to the second signal. The device can control a modulated intensity of electromagnetic energy. At least part of the electromagnetic energy can reside within, for example, in the optical C-band, or the optical L-band, or the both the L-band and the C-band from about 1530 nm to about 1610 nm. A response of the element can be made substantially proportional to the first signal over a range of the first signal, for example due at least to the second signal.

Figure 5:
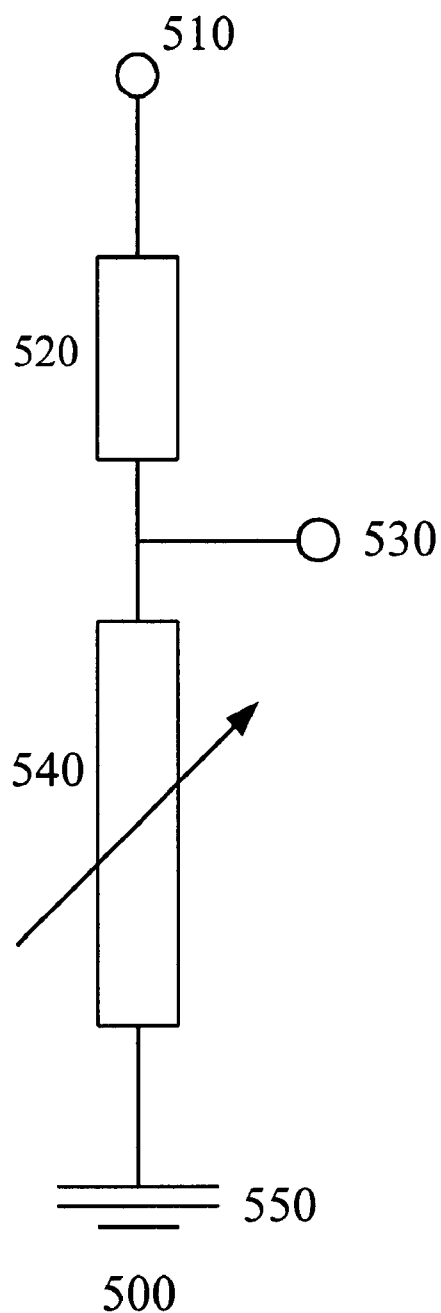
FIG. 5 shows a linearization apparatus.

FIG. 5 shows some embodiments 500 of a linearization apparatus. Some embodiments can comprise a first signal reference 510, a constant signal component 520, an output node 530, a variable signal component 540, and a second signal reference 550. The constant signal component 520 can be coupled to the first signal reference 510. The first signal reference 510 can comprise a variable input voltage or a constant voltage. The constant voltage can comprise a ground or some other voltage. The output node 530 can be coupled to the constant signal component 520. The constant signal component 520 can comprise a resistor, for example in a plurality of resistors. The constant signal component 520 and/or the variable signal component 540 can comprise a device having a reactance. The reactance can comprise at least one inductance and/or at least one capacitance. The output node 530 can provide an output signal controlling an element, for example, a membrane, a microelectromechanical device, and/or a device controlling a modulated intensity of electromagnetic energy. The apparatuses 500 can further comprise the element. The element can be coupled to the output node 530. The variable signal component 540 can be coupled to the output node 530 and to an input. The variable signal component 540 can comprise at least one variable resistor. At least one of the constant signal component 520 and the variable signal component 540 can comprise at least one of a current, a voltage, and a resistance. The constant signal component 520 and the variable signal component 540 can be coupled in series and/or in parallel. At least one look up table can comprise at least one of the constant signal component 520 and the variable signal component 540. The second signal reference 550 can be coupled to the variable signal component 540. A response of the element to the output signal can be substantially proportional to an input signal received at the input. The second signal reference 550 can comprise a constant voltage. The constant voltage can comprise a ground or some other voltage.

One embodiment of the apparatus includes a variable resistive divider. The divider can include a manually adjustable potentiometer, and/or an electronically controlled digital potentiometer. Some embodiments include a variable resistor which, when adjusted to its maximum resistance, is 17–25 times that of the fixed resistor. Other embodiments can use the 17–25 ratio of maximum magnitudes for other device combinations. The maximum magnitude can be a physical or software maximum of a device or an arbitrary limit that remains within a small range of a device.

Figure 6:
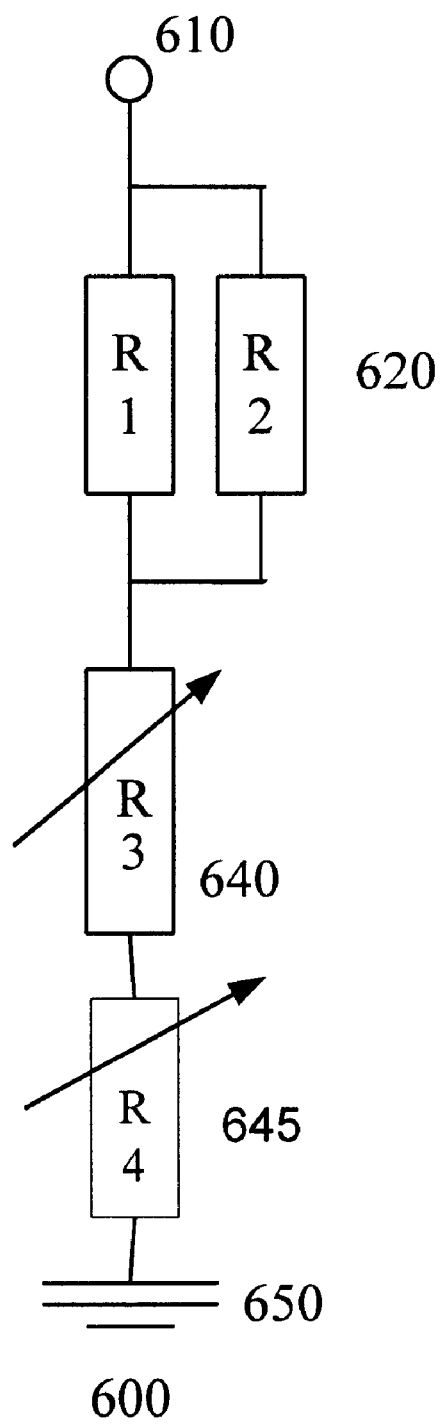
FIG. 6 shows another linearization apparatus.

FIG. 6 shows other embodiments 600 of a linearization apparatus. Some embodiments comprise a plurality of resistors 620 coupled in parallel, and a variable resistor 640. In one embodiment, the plurality of resistors 620 and the variable resistor 640 can be included in a quad-package digital potentiometer. The variable resistor 640 can be used as the variable part of the resistive divider. Another variable resistor 645 can also be used as another variable part of the resistive divider. The plurality of resistors 620 coupled in parallel can be programmed upon power-up.

Embodiments with a multi-resistor package include devices that are well-matched, such as in terms of fabrication quality and/or thermally during operation. Other embodiments include one or more of the devices in different packages. Embodiments with multiple devices for one or both of the constant signal component 520 and the variable signal component 540 can adjust an aggregate value in smaller increments. For example, if multiple resistors are in parallel, adjusting only one of the resistors results in a smaller adjustment.

Some embodiments include multiple devices for one or both of the constant signal component 520 and the variable signal component 540 to decrease temperature dependence. For example, some resistors with a resolution of a number steps, (e.g. the 4-in-a-package AD 8403 from Analog Devices, in which each resistor has a 256-step resolution) can exhibit a relatively high temperature coefficient of resistance at "small" counts (e.g., less than 16). By using a 2-up parallel combination for the constant signal component 520, and assuming a ratio of about 20 between the maximum resistance of the variable resistor in the variable signal component 540 and the resistance of the 2-up parallel combination in the constant signal component 520, each of the parallel resistors can be programmed to a value of (256/20)*2=25 or 26 counts, greater than 16 counts.

Although some embodiments of linearization assume only the variable signal component 540 to be variable, one or more devices of the constant signal component 520 can also be varied, for example for fine-adjustment.

Other embodiments include other configurations of resistors to implement the transfer function 200. Some configurations can give extra stability or precision depending on the components.

Other embodiments can include a capacitor in series with a resistor, combined with a V-f (voltage-frequency) converter and a RMS (root-mean-square) converter to provide similar functionality.

Constant values can be constant per use of an apparatus or method or for some duration smaller or longer than a use.

Other embodiments can further comprise receiving the second signal at the element, and controlling the element responsive to the second signal. At least one of the first quantity and the second quantity can comprise at least one of a current and a voltage. In some embodiments, at least one look up table can comprise at least one of the quotient and the first quantity.

Various embodiments can comprise parts coupled together physically and/or functionally. The various embodiments of the structures and methods that are described above are illustrative only and do not limit the scope to the particular embodiments described. For example, in view of this disclosure, those skilled in the art can define other electrical or optical or mechanical devices. The following claims cover such alternatives.

What is claimed is:

1. Apparatus for linearization of an output signal comprising:

a first input node adapted to receive an input signal for providing electrostatic control of a micromechanical device, the micromechanical device having a nonlinear response to increasing input signals;

a correction signal according to the formula x/(a+x), wherein x is a variable and a is a constant; and an output node for providing an output signal responsive to a combination of the input signal and the correction signal, the output signal providing linearized electrostatic control of the micromechanical device.

2. The apparatus of claim 1 wherein the correction signal is provided by a voltage divider.

3. The apparatus of claim 1 wherein the correction signal is generated by an entry in a lookup table.

4. The apparatus of claim 1 wherein the output node is at the same voltage as the first input node.

5. The apparatus of claim 1 wherein the output node is at a different voltage than the first input node.

* * * * *